(12) United States Patent
Zhou et al.

(10) Patent No.: US 9,228,262 B2
(45) Date of Patent: Jan. 5, 2016

(54) PLATING CATALYST AND METHOD

(71) Applicant: Rohm and Haas Electronic Material LLC, Marlborough, MA (US)

(72) Inventors: Wenjia Zhou, Fanling (CN); Suk Kwan Kwong, Fanling (CN); Chit Yiu Chan, Fanling (CN); Kwok-Wai Yee, Fanling (CN)

(73) Assignee: Rohm and Haas Electronic Materials LLC

( * ) Notice: Subject to any disclaimer, the term of this patent is extended or adjusted under 35 U.S.C. 154(b) by 0 days.

(21) Appl. No.: 14/740,828

(22) Filed: Jun. 16, 2015

(65) Prior Publication Data

US 2015/0284858 A1    Oct. 8, 2015

Related U.S. Application Data

(62) Division of application No. 13/732,220, filed on Dec. 31, 2012, now Pat. No. 9,149,798.

(60) Provisional application No. 61/582,265, filed on Dec. 31, 2011.

(51) Int. Cl.

| | | |
|---|---|---|
| *C23C 18/30* | (2006.01) | |
| *C23C 18/52* | (2006.01) | |
| *B01J 31/06* | (2006.01) | |
| *C23C 18/18* | (2006.01) | |
| *H05K 3/42* | (2006.01) | |
| *B01J 23/38* | (2006.01) | |
| *C23C 18/20* | (2006.01) | |
| *B01J 37/16* | (2006.01) | |
| *B01J 23/50* | (2006.01) | |
| *B01J 35/00* | (2006.01) | |
| *C23C 18/16* | (2006.01) | |
| *C23C 18/38* | (2006.01) | |
| *B01J 37/02* | (2006.01) | |

(52) U.S. Cl.
CPC .............. *C23C 18/52* (2013.01); *B01J 23/38* (2013.01); *B01J 23/50* (2013.01); *B01J 31/06* (2013.01); *B01J 31/062* (2013.01); *B01J 35/0013* (2013.01); *B01J 37/16* (2013.01); *C23C 18/1633* (2013.01); *C23C 18/1841* (2013.01); *C23C 18/1844* (2013.01); *C23C 18/208* (2013.01); *C23C 18/2086* (2013.01); *C23C 18/30* (2013.01); *H05K 3/422* (2013.01); *B01J 37/0219* (2013.01); *C23C 18/38* (2013.01)

(58) Field of Classification Search
CPC ...... C23C 18/30; C23C 18/1633; B01J 23/38; B01J 23/42; B01J 23/44; B01J 23/46; B01J 23/48; B01J 23/50; B01J 23/52; B01J 31/06; B01J 31/062; B01J 37/0219; B01J 37/16
USPC ............ 106/1.11, 1.18, 1.19, 1.21; 427/443.1
See application file for complete search history.

(56) References Cited

U.S. PATENT DOCUMENTS

| | | |
|---|---|---|
| 3,011,920 A | 12/1961 | Shipley, Jr. et al. |
| 3,904,792 A | 9/1975 | Gulla et al. |
| 3,993,799 A | 11/1976 | Feldstein |
| 4,248,632 A | 2/1981 | Ehrich et al. |
| 4,719,145 A | 1/1988 | Neely |
| 4,725,314 A | 2/1988 | Gulla et al. |
| 5,269,838 A | 12/1993 | Inoue et al. |
| 5,300,140 A | 4/1994 | Wolf et al. |
| 6,325,910 B1 | 12/2001 | Meyer et al. |
| 6,645,557 B2 | 11/2003 | Joshi |
| 7,166,152 B2 | 1/2007 | Okuhama et al. |
| 7,718,710 B2 | 5/2010 | Zhang et al. |
| 7,824,580 B2 | 11/2010 | Boll et al. |
| 8,383,014 B2 * | 2/2013 | Vanheusden .............. H01B 1/22 252/512 |
| 8,591,636 B2 | 11/2013 | Liu et al. |
| 8,591,637 B2 | 11/2013 | Rzeznik et al. |
| 8,828,131 B2 | 9/2014 | Yamamoto et al. |
| 2004/0040852 A1 | 3/2004 | Rzeznik et al. |
| 2005/0118436 A1 | 6/2005 | Bhangale et al. |
| 2006/0024481 A1 | 2/2006 | House et al. |
| 2009/0263496 A1 | 10/2009 | Kijlstra et al. |
| 2010/0059386 A1 | 3/2010 | Yamamoto et al. |
| 2010/0116168 A1 | 5/2010 | Chan et al. |
| 2011/0014473 A1 | 1/2011 | Ying et al. |
| 2013/0171363 A1* | 7/2013 | Zhou ...................... C23C 18/30 427/430.1 |
| 2013/0171366 A1 | 7/2013 | Zhou et al. |
| 2013/0205950 A1 | 8/2013 | Jurk et al. |
| 2013/0313490 A1 | 11/2013 | Eiden et al. |
| 2014/0120263 A1 | 5/2014 | Yee et al. |
| 2014/0242287 A1 | 8/2014 | Kwong et al. |

FOREIGN PATENT DOCUMENTS

| | | |
|---|---|---|
| JP | 10229280 | 8/1998 |
| JP | 11241170 A | 9/1999 |

(Continued)

OTHER PUBLICATIONS

European Search Report corresponds with Europe Application No. 12 19 9769, Jun. 24, 2014.

(Continued)

*Primary Examiner* — Helene Klemanski
(74) *Attorney, Agent, or Firm* — John J. Piskorski

(57) ABSTRACT

A catalyst solution includes a precious metal nanoparticle and a polymer having a carboxyl group and a nitrogen atom. The catalyst solution is useful for a catalyzing an electroless process for plating metal on non-conductive surfaces.

4 Claims, No Drawings

(56) References Cited

FOREIGN PATENT DOCUMENTS

| JP | 2001044242 A | 2/2001 |
| WO | 2008094144 A1 | 8/2008 |

OTHER PUBLICATIONS

Baypure DS 100 Material Safety Data Sheet (MSDS); 7 pages; no date available.

* cited by examiner

PLATING CATALYST AND METHOD

This application claims the benefit of priority under 35 U.S.C. §119(e) to U.S. Provisional Application No. 61/582,265, filed Dec. 31, 2011, the entire contents of which application are incorporated herein by reference.

FIELD OF THE INVENTION

The present invention relates to a catalyst solution including a precious metal nanoparticle. More particularly, the present invention relates to a catalyst solution including a precious metal nanoparticle stabilized by specific compounds useful in electroless metal plating of non-conductive substrates used in the manufacture of electronic devices and decorative coating.

BACKGROUND OF THE INVENTION

Electroless metal deposition or plating is useful for the deposition of a metal or mixture of metals on a non-conductive or dielectric surface in the absence of an electric source. Plating on non-conductive or dielectric substrates covers a wide range of applications, including decorative plating and electronic device fabrication. One of the main applications is the manufacture of printed circuit boards. The electroless deposition of a metal on a substrate usually requires pretreatment or sensitization of the substrate surface to make the surface catalytic to the deposition process. Various methods have been developed to catalyze the substrate.

U.S. Pat. No. 3,011,920 discloses a method to catalyze a substrate by immersion of the substrate in the colloidal catalyst solution prepared by palladium ions with stannous ions to form a palladium-tin colloid. This method requires a step of acceleration after catalyzing the substrate surface whereby the catalyst core is exposed. U.S. Pat. No. 3,904,792 discloses an improvement of colloidal palladium-tin catalysts to provide catalyst in less acidic environments. Hydrochloric acid is partially replaced by a soluble salt of the acid. Such a palladium-tin catalyst systems present a number of limitations. The outer shell of the catalyst colloid $(SnCl_4)^{2-}$ is easily oxidized, thus the catalyst particles grow in size and lose their catalytic surface area dramatically.

U.S. Pat. No. 4,725,314 discloses a process for preparing a catalytic adsorbate in aqueous solution using an organic suspending agent to protect the colloid with a maximum dimension not exceeding 500 angstroms. Polyvinyl pyrrolidone may serve as an organic suspending agent.

Because of the high cost of palladium, considerable effort has been focused on the development of non-noble metal catalyst systems. U.S. Pat. No. 3,993,799 discloses the use of a non-noble metal hydrous oxide colloid for treating non-conductive substrates followed by reduction of the hydrous oxide coating on the substrate to achieve at least a degree of activation for subsequent electroless plating. U.S. Pat. No. 6,645,557 discloses a method to form a conductive metal layer by contacting the non-conductive surface with an aqueous solution containing a stannous salt to form a sensitized surface followed by contacting the sensitized surface with an aqueous solution containing a silver salt having a pH in the range from about 5 to about 10 to form a catalyzed surface.

JP10229280A discloses a catalyst solution which is composed of silver nitrate or copper sulfate, as well as an anionic surfactant, such as polyoxyethylene lauryl ether sodium sulfate and a reducing agent such as sodium borohydride. JP11241170A discloses a non-palladium catalyst which includes at least one of iron, nickel, cobalt and silver salt, in conjunction with an anionic surfactant and a reducing agent.

JP200144242A discloses a manufacturing method for preparation of a high dispersing colloidal metal solution with high conductivity, which contains at least one amino group and one carboxyl group. U.S. Pat. No. 7,166,152 discloses a sliver colloid based pretreatment solution comprising three components: (i) sliver colloidal particles; (ii) one or more ions selected from metal ions having an electric potential which can reduce a sliver ion to silver metal in the solution; and (iii) one or more ions selected from a hydroxycarboxylate ion, a condensed phosphate ion and an amine carboxylate ion. Normally, aqueous solutions of colloidal tin-free silver are much more stable than those systems involving stannous ions, which are easily oxidized to tin (IV) with air agitation. Colloidal silver catalyst systems would reduce cost and be less unstable than palladium systems. Such colloidal silver catalyst systems also show promising catalytic properties in electroless plating processes without sacrificing the interconnect reliability. Therefore, a colloidal catalyst system which has a balance of bath stability, adsorption capability and catalytic activity at the same time is desired.

SUMMARY OF THE INVENTION

A solution includes a precious metal nanoparticle and a polymer, the polymer has a carboxyl group and a nitrogen atom within the repeating unit of the polymer.

A process for electroless plating a metal on non-conductive surface includes dipping a substrate to be plated into a solution which includes a precious metal nanoparticle and a polymer, the polymer has a carboxyl group and a nitrogen atom within the repeating unit of the polymer and conducting electroless plating of the substrate without an accelerating step.

Inventors of this invention have now found that a precious metal colloidal catalyst system, which includes precious metal nanoparticles stabilized by a specific type of polymer having carboxyl groups and nitrogen atoms and are tin-free show good stability and promising catalytic activity in electroless plating.

DETAILED DESCRIPTION OF THE INVENTION

As used throughout this specification the abbreviations given below have the following meanings, unless the content clearly indicates otherwise: g=gram; mg=milligram; ml=milliliter; L=liter; m=meter; cm=centimeter; min.=minute; s=second; h=hour; ppm=parts per million; M=molar; g/L=grams per liter; mmol=millimoles; Mw=molecular weight; rpm=revolutions per minute; and DI=deionized.

As used throughout this specification, the word "deposition" and "plating" are used interchangeably. The word "catalyzing" and "activating" are used interchangeably throughout this specification. The word "solution comprising precious metal nanoparticles" and "catalyst solution" are used interchangeably throughout this specification.

The present invention provides a solution for electroless plating including a precious metal nanoparticle and a polymer having a carboxyl group and nitrogen atom. The polymer used in this invention requires both a carboxyl group and a nitrogen atom. Preferably, the polymer has both a carboxylic group and a nitrogen atom within its repeating unit. As shown later, the solution which includes a polymer having both a carboxyl group and a nitrogen atom obtains better results with a stable catalyst solution in comparison with a solution having polymers with nitrogen atoms but no carboxyl group, such as polyacrylamide and polyvinyl pyrolidone. Though not wishing to be bound by theory, it is believed that carboxyl group is more important for the electrosteric stabilization of nanoparticles, while nitrogen atom is useful for the nanoparticles adsorption.

A polymer used in this invention requires a polymer. As shown later, inventors of the present invention conducted comparative examples for a solution containing L-aspartate instead of the polymer. L-aspartate is a low molecular weight compound having a carboxyl group and nitrogen atom. The nanoparticles prepared with L-aspartate are not as stable as those prepared with the polymer, and it could only be stabilized in alkaline pH medium. In addition, the results of backlight tests for a solution containing L-aspartate was poor compared to the results of a solution containing a polymer having a carboxyl group and a nitrogen atom.

The molecular weight (Mw) of the polymer for the composition is 400 to 1,000,000, more preferably, 1000 to 10,000.

The polymer useful for this invention is preferably polyamino acids and their copolymers. Examples of polyamino acids or their copolymers include polyaspartic acid, polyglutamic acid, polycyanophycin, copolymer of L-aspartic acid and L-alanine, copolymer of L-aspartic acid and glycine, copolymer of L-glutamic acid and glycine, copolymer of phenylalanine and glycine.

Other preferable polymers include copolymers of monomers having amide structures and monomers having carboxyl groups. Examples of a monomer having an amide structure are acrylamide, methacrylamide, vinylpyrrolidinone, N-(hydroxymethyl)methacrylamide) and 2-acrylamido-2-methypropane sulfonic acid. Examples of a monomer having carboxyl group are acrylic acid, methacrylic acid, maleic acid and citracomic acid.

The preferable amount of this polymer is 0.05 to 20 g/L, more preferably, 0.5 to 5.0 g/L, based on the total amount of catalyst solution.

Precious metal nanoparticles of the present solution are provided by any precious metal having catalyst activity. Examples of precious metal are silver, gold, platinum, palladium, rhodium, ruthenium, iridium and osmium. Preferable the precious metal is silver.

Mixtures of precious metals can be used, such as a mixture of silver and palladium. The amount of precious metal nanoparticles is 10 to 20000 ppm, preferably 100 to 10000 ppm, most preferably 200 to 5000 ppm based on the weight of the solution.

The ratio of metal and a polymer having a carboxyl group and nitrogen atom in the present solution is determined by moles of metal and carboxylic groups in the polymer, such as from 1:0.1 to 1:10, preferably, from 1:0.5 to 1:5.

Optionally, the present invention may include one or more of various additives common in electroless plating catalyst compositions, such as surfactants, buffers, complexing agents and pH adjuster. pH adjuster may include bases such as, but not limited to, sodium hydroxide and potassium hydroxide, and acids such as, but not limited to, sulfuric acid, oxalic acid, acetic acid, citric acid and other simple carboxylic acids. The amount of pH adjusters is based on the target pH value.

A solvent used in the present invention is preferably water, such as tap water or DI water. Any other solvent such as alcohol or mixtures of solvents may be used for the present invention whenever the solvent can mix with water.

Typically, the present solution has a pH of 3 to 10. The preferable pH of the present solution depends on the type and amount of polymers and reducing agents in nanoparticle preparation procedure. Preferably, the typical present solution has the pH of more than 4, more preferably, the pH is 6 to 9, and still more preferably, the pH is alkaline, that is it has a pH of more than 7 to 9.

The present solution has stable solutions of nanoparticles useful as a catalyst for electroless plating for non-conductive surface of a material to be plated. Preferably, the present solution does not form a visually observable precipitate. More preferably, the present solution does not form a visually observable precipitate after accelerated aging tests and accelerated shelf life tests. Extreme aging conditions have been tested, such as storage in 40° C. with air bubbling, high temperature and low temperature storage.

The solution of the present invention can be prepared by combining a precious metal ion, a polymer and a reducing agent in a solution. Preferably, the method for preparing a solution of this invention is (a) preparing a solution including precious metal ion and a polymer having a carboxyl group and a nitrogen atom, and (b) adding a reducing agent in the solution, under stirring.

The precious metal ion used in the present invention is provided by any precious metal source whenever the precious metal is solvent soluble. Organic or inorganic acids can be used with precious metal sources to help dissolve the precious metals into solution. Precious metal elements are selected from those which are described above, such as silver, gold, platinum, palladium, rhodium, ruthenium, iridium and osmium, and the preferable precious metal element is silver as described above.

Preferable precious metal ion sources are organic or inorganic salts of precious metals. Examples of preferable precious metal ion sources include, metal nitrates, metal nitrites, metal halides, metal oxides, metal acetates, metal sulfates, metal sulfites, metal cyanides, metal gluconates, metal fluoroborates, metal alkylsulfonates, metal thiosulfates and metal thiocyanate. Examples of metal salts include, without limitation, silver nitrate, silver acetate, silver sulfate, silver methanesulfonate, silver p-toluenesulfonate, silver benzoate, silver phosphate, silver trifluoroacetate, palladium nitrate, palladium chloride, palladium sulfate, palladium acetate, sodium tetrachloropalladate, ammonium tetrachloropalladate, palladium dichlorodiammine and palladium dichlorotetraammine.

The amount of the precious metal ions depend on the solubility of the metal salt and the desired concentration of precious metal nanoparticles in the solution of the present invention. For example, silver salts may be used in amounts of 0.01 to 100 g/L, preferably, 0.1 to 10 g/L, more preferably, 0.1 to 5.0 g/L as metal, based on the total amount of catalyst solution.

The reducing agent used for reducing the precious metal ions is any of those reducing agents capable of reducing dissolved precious metal ions to a reduced precious metal form without formation of by-products that would interfere with catalysis of the catalyst solution. Preferable reducing agents are dimethylamino borane, sodium borohydride, hydrazine, sodium hypophosphite, hydrazine hydrate, ascorbic acid, iso-ascorbic acid, hydroxylamine sulfate, formic acid and formaldehyde.

The amount of reducing agent is any amount sufficient to reduce the desired precious metal ions. The preferable amount of reducing agent may be decided by the ratio of the precious metal, such as 0.5 to 2 times by the moles of precious metal ions. Typically, the amount is 0.01 to 10 g/L, more preferably, 0.01 to 2 g/L, based on the total amount of metal concentration in the catalyst solution and the choice of reducing agent used in the reaction.

The method for preparing a solution of the present invention is, (a) preparing a solution comprising precious metal ions and a polymer having a carboxyl group and a nitrogen atom and (b) adding a reducing agent in said solution under stirring the solution.

The first step of the method is preparing a solution including precious metal ions and a polymer having a carboxyl group and a nitrogen atom. The solution which includes the precious metal ions and the polymer can be prepared by any method. For example, dissolve the polymer in a solvent such as water, then add a salt of precious metal or aqueous solution of precious metal salt into the solution; or dissolve a precious metal ion in a solvent, then add the polymer or a solution of the polymer into the solution.

The second step of the method is to add a reducing agent in the solution under stirring. The amount of reducing agent used in this step is any amount sufficient to form the desired precious metal nanoparticles.

Reducing agent is added in the above solution under stirring. Under strong stiffing conditions, the metal ions may be reduced to metal and quickly form nanocrystals which serve as seeds for further nanoparticle growth. If the stirring is inadequate, the particles size may be non-uniform and some of the particles may grow larger and may precipitate easily. In other words, strong stirring allows formation of smaller nanoparticles in a narrower particle size distribution. The typical mixing rates may be from 200 to 1000 rpm.

The temperature of the solution during the second step is 10 to 40° C., typically around room temperature or 20° C.

Though not wishing to be bound by theory, the inventors believe that the mechanism of forming stable precious metal nanoparticles in the presence of the polymer of this invention is as follows: generally, the nanoparticles have a tendency to collide with each other due to Brownian motion, convection, gravity and other forces, which may result in aggregation and destabilization of the colloid. Electrostatic stabilization and steric stabilization of colloids are the common two mechanisms for colloid stabilization. With the presence of polymer, the as prepared nanoparticles may be surrounded by the polymeric molecules, and the polymeric molecules create a repulsive force counterbalancing the attractive Van der Waals force among particles.

A preferred method for preparing colloidal catalyst solutions is preparing a solution which includes 1 to 5 g/L of silver ions and 1 to 5 g/L of sodium polyaspartate, then adding 10 to 80 mmol/L of dimethylamino borane under strong stiffing or 200 to 800 rpm at 20 to 40° C.

The solution containing a precious metal nanoparticle and a polymer having a carboxyl group and nitrogen atom can be used in the electroless plating process for printed circuit boards. Through-holes are formed in the printed circuit board by drilling or punching or any other method known in the art. After the formation of the through-holes, the boards are rinsed with water and a conventional organic solution to clean and degrease the board is applied followed by desmearing the through-hole walls. Typically desmearing of the through-holes begins with application of a solvent swell. Any conventional solvent swell may be used to desmear the through-holes. Solvent swells include, but are not limited to, glycol ethers and their associated ether acetates. Conventional amounts of glycol ethers and their associated ether acetates may be used. Such solvent swells are well known in the art. Commercially available solvent swells include, but are not limited to, CIRCUPOSIT CONDITIONER™ 3302 solution, CIRCUPOSIT HOLE PREP™ 3303 and CIRCUPOSIT HOLE PREP™ 4120 solutions all obtainable from Rohm and Haas Electronic Materials, Marlborough, Mass.

Optionally, the through-holes are rinsed with water. A promoter is then applied to the through-holes. Conventional promoters may be used. Such promoters include sulfuric acid, chromic acid, alkaline permanganate or plasma etching. Typically alkaline permanganate is used as the promoter. An example of a commercially available promoter is CIRCUPOSIT PROMOTER™ 4130 solution available from Rohm and Haas Electronic Materials.

Optionally, the through-holes are rinsed again with water. A neutralizer is then applied to the through-holes to neutralize any residues left by the promoter. Conventional neutralizers may be used. Typically the neutralizer is an aqueous alkaline solution containing one or more amines or a solution of 3 wt % peroxide and 3 wt % sulfuric acid. Optionally, the through-holes are rinsed with water and the printed circuit boards are dried.

After desmearing an acid or alkaline conditioner may be applied to the through-holes. Conventional conditioners may be used. Such conditioners may include one or more cationic surfactants, non-ionic surfactants, complexing agents and pH adjusters or buffers. Commercially available acid conditioners include, but are not limited to, CIRCUPOSIT CONDITIONER™ 3320 and CIRCUPOSIT CONDITIONER™ 3327 solutions available from Rohm and Haas Electronic Materials. Suitable alkaline conditioners include, but are not limited to, aqueous alkaline surfactant solutions containing one or more quaternary amines and polyamines. Commercially available alkaline surfactants include, but are not limited to, CIRCUPOSIT CONDITIONER™ 231, 3325, 813 and 860 solutions available from Rohm and Haas Electronic Materials. Optionally, the through-holes are rinsed with water after conditioning.

Conditioning is followed by microetching the through-holes. Conventional microetching compositions may be used. Microetching is designed to provide a micro-roughened copper surface on exposed copper, e.g. innerlayers and surface etch, to enhance subsequent adhesion of deposited electroless and electroplate. Microetches include, but are not limited to, 60 g/L to 120 g/L sodium persulfate or sodium or potassium oxymonopersulfate and sulfuric acid 2% mixture, or generic sulfuric acid/hydrogen peroxide. An example of a commercially available microetching composition includes CIRCUPOSIT MICROETCH™ 3330 solution available from Rohm and Haas Electronic Materials. Optionally, the through-holes are rinsed with water.

A pre-dip is then applied to the microetched through-holes. Any acidic solution capable of removing copper oxides on copper surface without interfering with the catalyst solution can be used. Examples of pre-dips include oxalic acid, acetic acid, ascorbic acid, phenolic acid, phosphoric acid, boric acid, and salts thereof. Optionally, the through-holes are rinsed with cold water.

A catalyst, a solution including a precious metal nanoparticle, as described above is then applied to the through-holes. The walls of the through-holes are then plated with copper with an alkaline electroless composition. Any conventional electroless plating bath may be used. A commercially available electroless copper plating bath includes, but are not limited to, CIRCUPOSIT™ 880 Electroless Copper plating solution available from Rohm and Haas Electronic Materials.

After the copper is deposited on the walls of the through-holes, the through-holes are optionally rinsed with water. Optionally, anti-tarnish compositions may be applied to the metal deposited on the walls of the through-holes. Conventional anti-tarnish compositions may be used. Examples of anti-tarnish compositions include ANTI TARNISH™ 7130 and CUPRATEC™ 3 compositions obtainable from Rohm and Haas Electronic Materials. The through-holes may optionally be rinsed with hot water at temperatures exceeding 30° C. and then the boards may be dried.

The following examples are intended to further illustrate the invention but are not intended to limit its scope.

EXAMPLES

Test Method

The properties of a catalyst were evaluated by observing electroless copper plating of a test coupon according to the process described below. A conventional FR-4 laminate, SY-1141 (normal $T_g$) test coupon from Shengyi was used. For surface coverage test a bare laminate was used. For backlight testing a Cu clad laminate with an inner layer of copper was used.

(1) The test coupon was cut into 1×6 cm² pieces, and its edges were sandblasted by SiC#240 particles, then cleaned in RO (Reverse Osmosis) water for several times and blow dried.
(2) Processing was done through the swelling, oxidizing, neutralizing, conditioning and microetching steps shown in table 1.
(3) The test coupon was dipped in the catalyst solution at 40° C. for 3-10 minutes at specific pH described in each Example. The test coupon was washed with deionized water.
(4) Electroless copper plating was done at 40° C. for 15 minutes.

TABLE 1

Process flow for electroless Cu deposition tests

| Process | Components | Volume | Temperature [° C.] | Duration [min] | Rinse time [min] |
|---|---|---|---|---|---|
| 1 Swelter | Hole Promoter 211 CUPOSIT ™ Z | 12.5% 10.0% | 80 | 7 | 3 |
| 2 Oxidizer | Oxidizer 213A-1 CUPOSIT ™ Z | 10.0% 15.0% | 80 | 10 | 3 |
| 3 Neutralizer | Neutralizer 216-5 | 5.0% | 42 | 5 | 3 |
| 4 Conditioner | Cleaner Conditioner 231 | 3.0% | 43 | 5 | 4 |
| 5 MicroEtch | Sodium Persulfate $H_2SO_4$ | 75 g/L 2.0% | RT | 2 | 3 |
| 6 Catalyst | Ag: 300 ppm | 30.0% | 40 | 10 | 3 |
| 7 Electroless Copper | CIRCUPOSIT ™ 880 Electroless Copper | Nil | 40 | 15 | 2 |

1. Plating Coverage Test

The plating coverage test for the coupon was assessed using the plating coverage grading scale defined below.
Full coverage—more than 95% of the area on the surface of the test coupon was plated.
High—more than 75% and less than 95% of the area on the surface of test coupon was plated.
Medium—more than 50% and less than 75% of the area on the surface of test coupon was plated.
Low—more than 5% and less than 50% of the area on the surface of test coupon was plated.
No Coverage—less than 5% of the area on the surface of test coupon was plated.

2. Backlight Test

The backlight test was conducted according to the process below. 1-mm-thick cross sections from each board were placed under a conventional optical microscope of 50× magnification in its transmission mode. The quality of the copper deposit was determined by the amount of light that was observed under the microscope and compared with the European backlight Grading Scale (0-5). If no light was observed, the section was completely black and was rated 5.0 on the backlight scale. This indicated complete copper coverage. If light passed through the entire section without any dark area, this indicated very little to no copper metal deposition on the walls and the section was rated 0. If sections had some dark regions as well as light regions, they were rated between 0 and 5 comparing with the standard.

3. ICD Test

Reliability of plating was measured by the following ICD test (Interconnect defects test)

A drilled MLB (multi-layer board) coupon was cut containing at least 30 holes with hole diameters of 1 mm. The coupon edge was ground by SiC paper with Grit#240. Ultrasonic cleaning was done in RO water for several times. The process was run from desmear to PTH (plated through hole) and finally to copper electroplating. Any Cu on each edge of the coupon was ground away. The coupon was backed at 125° C. for 6 h. The coupon was cooled down in dry cabinet. An alternative solder dip was done at 288° C. for 10 seconds, cooled at room temperature for 110 seconds. The cycle was repeated 6 times. Micro-section was performed on the coupon and it was investigated for ICDs before etching. The number of defects were counted in the interconnecting regions and calculated as the rate.

The coupons were etched with an ammonia solution of 20 ml ammonium solution, 20 ml water and 10 drops hydrogen peroxide. The number of defects on the ICD was confirmed.

Example 1

Ag-PASP Catalyst System

Step 1: 1.0 g of polysuccinimide was mixed with 200 ml of deionized water with stiffing and then 10 ml/L of 1.0 mol/L sodium hydroxide solution were added into the mixed solution with stirring and with heating at 30-90° C. The Mw of the compound obtained was around 1100 measured by GPC method.

Step 2: 200 ml of the above solution was mixed into 800 ml of deionized water and 1.7 g of silver nitrate was added into the solution with stirring.

Step 3: 10 ml of freshly prepared 2.0 mol/L dimethylaminoborane (DMAB) was quickly added into the above solution with strong stirring at 500 rpm using magnetic stirrer. Stirring was done for over 2 h.

Accelerated aging test was conducted based on air bubbling of a testing solution at a rate of 10 mL/min under a temperature bath maintaining at 40° C. After one month, the catalyst solution was still in a good state.

Accelerated shelf life test at −20° C. and 60° C. for 48 hours was also conducted and there was no visually observable precipitate and no catalytic activity loss.

Example 2

Ag-PASP Catalyst System

Step 1: 3.2 g of 40% sodium polyaspartate (PASP) solution (Mw=3,000-5,000) was mixed with 990 ml of deionized water with stirring. 1.7 g of silver nitrate was added into the solution with stirring.

Step 2: 10 ml of freshly prepared 2.0 mol/L dimethylaminoborane (DMAB) was quickly injected into the above solution with strong stirring at 500 rpm using a magnetic stirrer. Stirring was done for over 2 h. The resulting solution had pH of 9.0.

The accelerated aging test and accelerated shelf life test of Example 1 were conducted and no precipitate or turbidity was observed.

Examples 3-13

Ag-PASP Catalyst Systems

Ag-PASP catalyst solution was prepared as in Example 2 except the concentration of each ingredients and temperature were changed as shown in Table 2.

TABLE 2

| Example | Ag (ppm) | PASP (g/L) | DMAB (mmol/L) | Temperature (degree C.) | pH |
|---|---|---|---|---|---|
| 3 | 1080 | 0.85 | 20 | 27.2 | 7.8 |
| 4 | 1080 | 1.27 | 20 | 26.5 | 7.9 |
| 5 | 1080 | 1.69 | 20 | 27.2 | 8.0 |
| 6 | 1080 | 2.12 | 20 | 26.8 | 8.0 |
| 7 | 1296 | 1.27 | 24 | 26.2 | 7.4 |
| 8 | 1512 | 1.27 | 28 | 27.4 | 7.3 |
| 9 | 1728 | 1.27 | 32 | 27.7 | 7.2 |
| 10 | 1080 | 1.27 | 20 | 21.6 | 8.5 |
| 11 | 2160 | 2.54 | 40 | 20.4 | 8.2 |
| 12 | 3240 | 3.81 | 60 | 20.9 | 8.0 |
| 13 | 4320 | 4.08 | 80 | 21.5 | 7.8 |

The performance tests were conducted on Example 2. The results of the coverage test, backlight test and ICD test were shown in table 3. The pH was adjusted using sulfuric acid or sodium hydroxide.

TABLE 3

| Test pH | 2.9 | 4.0 | 4.5 | 5.2 | 9.0 |
|---|---|---|---|---|---|
| Coverage | Full | Full | Full | Full | Middle |
| Backlight | 4.5 | 4.5 | 4.5 | 2.9 | — |
| ICD (%) | — | <0.3% | <0.3% | — | — |

Examples 14-21

Ag-PGA Catalyst System

Ag-polyglutamic acid solution was prepared as in Example 2 except that PASP was changed to polyglutamic acid (PGA) (Mw>500,000) and the concentration of each ingredient was changed as shown in Table 4.

TABLE 4

| No. | Ag (ppm) | polyglutamic acid (g/L) | DMAB (mmol/L) | Temperature (degree C.) | pH |
|---|---|---|---|---|---|
| 14 | 1080 | 0.2 | 20 | 24.3 | 5.7 |
| 15 | 1080 | 0.5 | 20 | 24.4 | 5.8 |
| 16 | 1080 | 1.0 | 20 | 24.5 | 5.9 |
| 17 | 1080 | 2.0 | 20 | 24.7 | 6.2 |
| 18 | 1080 | 0.5 | 20 | 25.3 | 5.6 |
| 19 | 1080 | 2.0 | 20 | 25.5 | 6.2 |
| 20 | 1080 | 3.2 | 20 | 25.7 | 6.2 |
| 21 | 1080 | 4.5 | 20 | 25.7 | 6.2 |

The performance tests were conducted on Example 19. The results of the coverage test and backlight test are shown in Table 5.

TABLE 5

| Test pH | 3.0 | 4.0 | 5.0 |
|---|---|---|---|
| Coverage | Full | Low | No |
| Backlight | 4.7 | — | — |

Examples 22-25

Ag-Copolymer of AA and AMPS Catalyst System

Ag-copolymer of Acrylic acid (AA) and 2-acrylamido-2-methypropane sulfonic acid (AMPS) solution was prepared as in Example 2 except PASP was changed to a copolymer of Acrylic acid and 2-acrylamido-2-methypropane sulfonic acid (Mw=10,000), and the concentration of each ingredient was changed as shown in Table 6.

TABLE 6

| No. | Ag (ppm) | AA/AMPS (g/L) | DMAB (mmol/L) | Temperature (degree C.) | pH |
|---|---|---|---|---|---|
| 22 | 540 | 1.0 | 10 | 18.1 | 4.0 |
| 23 | 1080 | 1.0 | 20 | 18.2 | 3.8 |
| 24 | 1620 | 1.0 | 30 | 18.1 | 3.6 |
| 25 | 2160 | 1.0 | 40 | 18.2 | 3.5 |

The performance tests were conducted on Example 24. The results of coverage test and backlight test are shown in Table 7.

TABLE 7

| Test pH | 3.5 | 5.0 | 7.0 |
|---|---|---|---|
| Coverage | Full | High | No |
| Backlight | 4.25 | 4.0 | — |

Comparative Example 1

Ag-ASP Catalyst System

Ag-L-aspartate solution was prepared as in Example 2 except PASP was changed to L-aspartate (ASP), DMAB was changed to NaBH$_4$, and the concentration of each ingredient was changed as shown in Table 8.

TABLE 8

| No. | Ag (ppm) | L-aspartate (g/L) | NaBH4 (mmol/L) | Temperature (degree C.) | pH |
|---|---|---|---|---|---|
| 1 | 216 | 1.95 | 8 | 26.3 | 10.2 |

The performance tests were conducted on Comparative Example 1. The results of coverage test and backlight test are shown in Table 9.

TABLE 9

| Test pH | 9.9 |
|---|---|
| Coverage (35 degree C.) | Full |
| Coverage (40 degree C.) | Full |
| Backlight | 3.5 |

The nanoparticles prepared with L-aspartate were not as stable as those prepared with polyaspartate, and it could only be stabilized in alkaline pH medium, while the nanoparticles prepared with polyaspartate were able to be stabilized in a broader pH range of 4-10.

Comparative Examples 2-5

Ag-PAM Catalyst System

Attempts were made to obtain Ag-polyacrylamide (PAM) solution as in Example 2 excepting PASP was changed to 0.2-2.0 g/L of PAM, and the concentration of each ingredient was changed as shown in Table 10.

TABLE 10

| No. | Ag (ppm) | PAM (g/L) | DMAB (mmol/L) | Temperature (degree C.) | pH |
|---|---|---|---|---|---|
| 2 | 1080 | 0.2 | 10 | 24.5 | 5.37 |
| 3 | 1080 | 0.4 | 10 | 25.3 | 5.70 |
| 4 | 1080 | 1.0 | 10 | 25.8 | 5.76 |
| 5 | 1080 | 2.0 | 10 | 25.8 | 5.77 |

However, with the addition of 0.2 or 0.4 g/L of PAM as stabilizer and after 10 to 20 minutes following the injection of reducing agent, a brown precipitate appeared. With 1.0 g/L of PAM, there were also precipitates which settled at the container bottom after 1 day of aging. With 2.0 g/L of PAM, the reaction took place quite slowly and resulted in gel formation immediately. A stable colloidal catalyst could not be obtained with PAM as the stabilizer.

Comparative Examples 6-11

Ag-PVP Catalyst System

Ag-polyvinyl pyrolidone (PVP) catalyst system was prepared as in Example 2 except PASP was changed to 0.2-9.0 g/L of PVP (Fluka K25, Mw=24,000), and the concentration of each ingredient was changed as shown in Table 11.

TABLE 11

| No. | Ag (ppm) | PVP (g/L) | DMAB (mmol/L) | Temperature (degree C.) | pH |
|---|---|---|---|---|---|
| 6 | 1080 | 0.2 | 10 | 22 | 4.6 |
| 7 | 1080 | 0.4 | 10 | 22 | 4.3 |
| 8 | 1080 | 1.0 | 10 | 22 | 4.1 |
| 9 | 1080 | 2.0 | 10 | 22 | 3.9 |
| 10 | 1080 | 5.0 | 10 | 22 | 3.6 |
| 11 | 1080 | 9.0 | 10 | 22 | 3.5 |

All the solutions showed turbid appearance.

The performance tests were conducted on Comparative Example 10. The results of coverage test are shown in Table 12.

TABLE 12

| Test pH | 3.5 | 4.5 | 6.0 |
|---|---|---|---|
| Coverage | No | No | No |
| Backlight | — | — | — |

As described in the examples and comparative examples, the solution of the present invention (the solution comprising precious metal nanoparticle and a polymer having carboxyl group and nitrogen atom) had high adsorption capability and catalytic activity as well as good bath stability compared with the solution containing other components.

What is claimed is:

1. A process for electroless plating a metal on non-conductive surface, the process comprises:
   dipping a substrate to be plated into a solution comprising a precious metal nanoparticle and a polymer, the polymer comprises a carboxyl group and a nitrogen atom within a repeating unit of the polymer and a mole ratio of the precious metal nanoparticle to the carboxyl group of the polymer is 1:0.1 to 1:10; and
   conducting electroless plating of the substrate without an accelerating step.

2. The process of claim 1, wherein the polymer is a polyamino acid.

3. The process of claim 1, wherein the polymer is polyaspartate.

4. The process of claim 1, wherein the precious metal is silver, gold, platinum, palladium, rhodium, ruthenium or osmium.

* * * * *